United States Patent
Frison

(10) Patent No.: US 9,658,290 B2
(45) Date of Patent: May 23, 2017

(54) SYSTEM AND METHOD OF BATTERY LIFE ESTIMATION

(71) Applicant: Honeywell International Inc., Morristown, NJ (US)

(72) Inventor: Andrea Frison, Monfalcone (IT)

(73) Assignee: LIFE SAFETY DISTRIBUTION AG, Hegnau (CH)

( * ) Notice: Subject to any disclaimer, the term of this patent is extended or adjusted under 35 U.S.C. 154(b) by 750 days.

(21) Appl. No.: 14/085,096

(22) Filed: Nov. 20, 2013

(65) Prior Publication Data
US 2015/0142351 A1  May 21, 2015

(51) Int. Cl.
| | |
|---|---|
| G01R 31/36 | (2006.01) |
| G08B 29/18 | (2006.01) |
| H01M 10/48 | (2006.01) |
| H02J 7/00 | (2006.01) |

(52) U.S. Cl.
CPC ....... *G01R 31/362* (2013.01); *G01R 31/3658* (2013.01); *G01R 31/3679* (2013.01); *G08B 29/181* (2013.01); *H02J 7/0063* (2013.01); *G01R 31/3689* (2013.01); *H01M 10/482* (2013.01); *H02J 2007/0067* (2013.01)

(58) Field of Classification Search
CPC ........ C01R 31/3658; H02J 7/0063; H02J 2007/0067; G08B 29/181; G01R 31/3689; G01R 31/3679; G01R 31/362; H01M 10/482
USPC ........ 702/63; 320/132, 106, 130, 118, 125, 320/127, 137, 160; 324/426, 434; 307/150, 86, 66, 87
See application file for complete search history.

(56) References Cited

U.S. PATENT DOCUMENTS

| | | | | |
|---|---|---|---|---|
| 4,937,528 A | * | 6/1990 | Palanisamy ........ | G01R 31/3648 320/132 |
| 4,968,942 A | * | 11/1990 | Palanisamy .......... | G01R 31/007 324/427 |
| 5,281,919 A | * | 1/1994 | Palanisamy .......... | G01R 31/007 324/427 |

(Continued)

FOREIGN PATENT DOCUMENTS

| | | | | |
|---|---|---|---|---|
| FR | WO 2013033114 A1 | * | 3/2013 | ........... A61B 6/0414 |
| WO | WO 95/19564 A1 | | 7/1995 | |

(Continued)

OTHER PUBLICATIONS

Extended European search report for corresponding EP patent application 14189813.0, dated Sep. 22, 2015.

(Continued)

*Primary Examiner* — Carol S Tsai
(74) *Attorney, Agent, or Firm* — Husch Blackwell LLP

(57) ABSTRACT

A device that includes a plurality of substantially identical batteries coupled via switching circuits to a power bus is provided. Control circuits can be coupled to the batteries and the switching circuits to provide electrical energy to the bus from each of the batteries during a sequence of predetermined time intervals, wherein one of the batteries provides electrical energy to the bus during a greater percentage of each time intervals than the others of the plurality. The remaining battery life of the others of the plurality can be estimated in response to sensing that the one of the batteries is substantially discharged.

5 Claims, 1 Drawing Sheet

(56) References Cited

U.S. PATENT DOCUMENTS

| | | | |
|---|---|---|---|
| 6,268,710 B1 | 7/2001 | Koga | |
| 6,650,089 B1 * | 11/2003 | Freeman | H02J 7/0047 320/130 |
| 7,683,576 B2 | 3/2010 | Tien et al. | |
| 2013/0033114 A1 | 2/2013 | Lee et al. | |

FOREIGN PATENT DOCUMENTS

| | | | |
|---|---|---|---|
| WO | WO 9519564 A1 * | 7/1995 | B60L 11/1861 |
| WO | WO 99/01918 A2 | 1/1999 | |
| WO | WO 2013/022857 A2 | 2/2013 | |

OTHER PUBLICATIONS

Patent Examination Report No. 1 from corresponding AU application 2014253513, dated May 5, 2015.
Partial European Search Report for corresponing EP application 14189813.0, dated May 6, 2015.

* cited by examiner

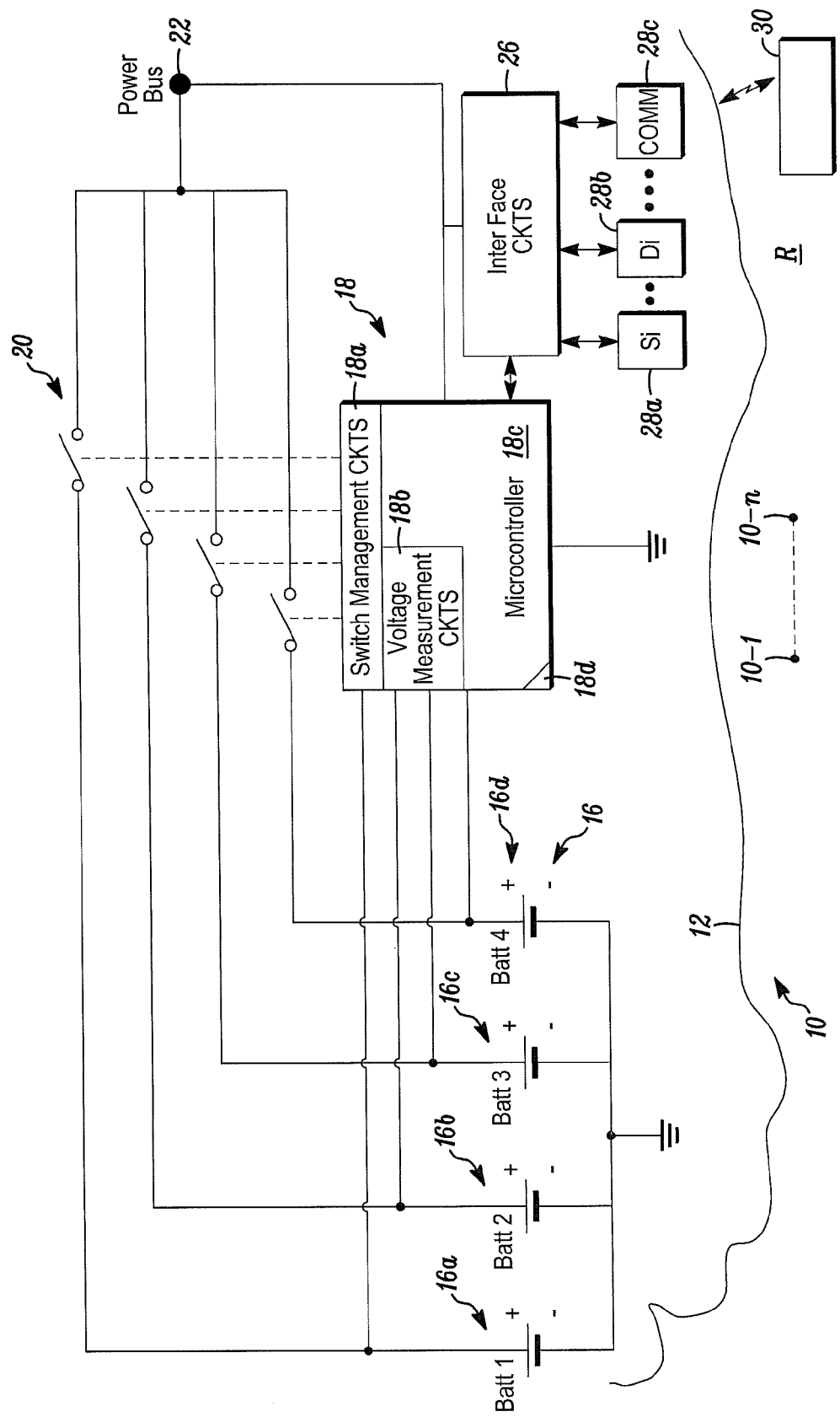

SYSTEM AND METHOD OF BATTERY LIFE ESTIMATION

FIELD

The application pertains to the management of multiple batteries in electrical devices. More particularly, the application pertains to systems and methods for estimating remaining battery life.

BACKGROUND

One of the problems associated with battery powered devices is correctly estimating the remaining battery life. It is useful to be able to correctly estimate this parameter because it facilitates programming the replacement of the batteries. Such programs are particularly useful when the battery powered devices are part of a more complex system in which more than one device is to be monitored. For example, wireless fire detection systems can include hundreds of installed devices, and it is important to correctly program the maintenance activities.

Various problems are present in determining the remaining battery life of a system. Common problems can include one or more of the following issues. Battery performance can strongly depend on the environmental condition, especially temperature (the battery life is strongly reduced at low temperatures). The performance of a battery strongly depends on the type of usage, for example, high current sink for short periods or constant sink for long periods. Battery life depends on the aging of the battery. A battery can stay on the shelf an undetermined period before being installed. Additional problems include output voltage characteristics. The voltage output of some types of batteries, such as lithium ion types, is constant for most of their life, having a rapid fall of voltage with a sharp knee at the end of their life.

These above noted characteristics make it difficult to estimate the battery life by only measuring the output voltage or simply measuring the time from the installation. It is obvious that being too conservative in battery life estimation has a negative impact on the frequency of maintenance services as well as a negative impact on the environment. It is preferable that batteries that are not completely exhausted are not replaced too soon.

BRIEF DESCRIPTION OF THE DRAWING

FIG. 1 is a block diagram of an apparatus in accordance herewith.

DETAILED DESCRIPTION

While disclosed embodiments can take many different forms, specific embodiments hereof are shown in the drawings and will be described herein in detail with the understanding that the present disclosure is to be considered as an exemplification of the principles hereof as well as the best mode of practicing the same and is not intended to limit the claims hereof to the specific embodiment illustrated.

In one aspect hereof, battery life estimation can be incorporated into devices that are powered by two or more independent identical batteries in combination with control circuits. For example, a microcontroller in combination with interface circuits can be used to implement the present method.

An example with four independent batteries is described subsequently. Those of skill will understand that the apparatus and methods hereof can be used with any number of batteries, depending on the characteristics of the devices being powered by the batteries.

In accordance herewith, different batteries can be used for different percentages of time. In another aspect, all of the batteries are used routinely. This is desirable given the characteristics of battery contacts. One of the batteries is used more extensively than the others. When this battery becomes discharged, the output voltage can be measured. Knowing the period for which it has been used, the remaining life of the other batteries can be estimated.

It will also be possible to calculate the percentage of use of remaining batteries in order to make a determination as to when only one battery will be charged. The remaining life for this battery can then be determined.

The method will give reliable results since the battery life is measured in real conditions of use. Additionally, supposing the batteries have come from the same batch, which is highly probable in commercial systems, "on the shelf" aging can be taken into account.

Advantageously, the present method differs from the current methods that estimate the remaining life by only measure the voltage on the batteries. An assumption is then made as to the relationship between the voltage and the remaining battery life.

By way of an example using four batteries, we can use battery number one for 100% of the time and not use the others at all. When this battery reaches the end of its life (determined by measuring the output voltage), we can say that we have three times this duration of battery life left in the remaining batteries.

Suppose that this time has been measured and is a duration of twelve months, and we want the process to finish with two batteries completely exhausted and one with six months of remaining life. In this instance, we have a total available life of 12×3=36 months. In 36−6=30 months, we want to use all of the power of two batteries and just half of the power of the other one. This means that we have an estimated battery life of twenty four months for the 2 batteries (24/30=80% of the time) while the third one is to be used for half of the estimated battery (6/30=20% of the time).

This calculation can be extended to a generic number n of batteries (n>=2) with a generic estimated life (Tlife) from the first part of the method and a generic remaining life of the last battery (Tleft<=Tlife).

In accordance with the above:

% of usage of last battery=(Tlife−Tleft)/(Tlife(n−1)−Tleft)

% of usage of other batteries=(n−2)Tlife/(Tlife(n−1)−Tleft).

It is understood that the percentage of use must be distributed in time in order to have all of the batteries working in all conditions, for example, not having one battery working during daytime and the other only at night because the environmental conditions and workload could be different.

FIG. 1 illustrates an exemplary apparatus 10 that implements the above described process. The apparatus 10 can, for example, implement a wireless ambient condition detector of smoke, gas, flame or the like all without limitation.

The apparatus 10 can be carried by a housing 12. The housing 12 can carry a plurality of identical batteries 16 having members 16a, 16b, 16c, and 16d. It will be understood that the use of four batteries is exemplary only and is not a limitation hereof.

The housing 12 can also carry control circuits 18. The control circuits 18 can include battery switch management circuits 18a that, via switching elements indicated at 20, can couple one or more of the batteries 16 to a power bus, indicated at 22, for the apparatus 10. The control circuits 18 can include voltage measurement circuits 18b that can be used to measure operating parameters, for example, output voltage of each of the batteries 16a, 16b . . . 16n. The control circuits 18 can be implemented at least in part by a programmed processor 18c and local control circuitry 18d that is executed by the processor 18c.

Interface circuits 26 coupled to the control circuits 18 can be used to couple signals to/from one or more ambient condition sensors 28a, output devices 28b, or communication interfaces 28c. All of the elements 18, 26, and 28 can be powered off of the bus 22.

In operation, the apparatus 10 can carry out an analysis of battery performance on a per apparatus or device basis as described above. Results can be coupled via the wireless interface 28c to a displaced monitoring system 30. It will be understood that the monitoring system 30 can be in communication and control a plurality of devices 10-1, 10-2, 10-3 . . . 10-n, such as the device 10, without limitation.

In accordance herewith, a battery management program can be implemented using the system 30 across a plurality of devices 10, 10-1, 10-2 . . . 10-n. The devices 10-1, 10-2 . . . 10-n can be installed in a region R that the system 30 is monitoring.

In summary, a device and a method are provided in which a plurality of substantially identical batteries are coupled via switching circuits to a power bus. Control circuits coupled to the batteries and the switching circuits provide electrical energy to the bus from each of the batteries during a sequence of predetermined time intervals, wherein one of the batteries provides electrical energy to the bus during a greater percentage of each time interval than the others of the plurality. Remaining battery life of the others of the plurality is estimated in response to sensing that the one of the batteries is substantially discharged.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

Further, logic flows depicted in the figures do not require the particular order shown or sequential order to achieve desirable results. Other steps may be provided, steps may be eliminated from the described flows, and other components may be added to or removed from the described embodiments.

The invention claimed is:

1. An apparatus comprising:
a plurality of batteries;
a plurality of switches electrically coupled to the plurality of batteries;
a power bus electrically coupled to the plurality of switches;
voltage measurement circuits coupled to the plurality of batteries to separately measure a voltage output from each of the plurality of batteries;
switching circuits that control the plurality of switches to selectively switch among the plurality of batteries so that only a single battery of the plurality of batteries is electrically coupled to the power bus for a predetermined percentage of a predetermined time interval; and
a microcontroller electrically coupled to the voltage measurement circuits and the switching circuits to track a total connection time that each of the plurality of batteries is coupled to the power bus by the switching circuits,
wherein the predetermined percentage of the predetermined time interval for one of the plurality of batteries is greater than the predetermined percentage of the predetermined time interval for other batteries of the plurality of batteries, and
wherein the voltage measurement circuits determine when the one of the plurality of batteries has been discharged, and, responsive thereto, the microcontroller calculates a remaining lifetime for each of the other batteries of the plurality of batteries as a function of the total connection time for each of the plurality of batteries.

2. The apparatus as in claim 1 further comprising at least one ambient condition sensor electrically coupled to and receiving power from the power bus.

3. The apparatus as in claim 1 wherein, responsive to the voltage measurement circuits determining when the one of the plurality of batteries has been discharged, the microcontroller stores the total connection time of the one of the plurality of batteries as a life-time parameter for each of the plurality of batteries.

4. The apparatus as in claim 1 wherein the microcontroller transmits an indicator of the remaining lifetime of each of the other batteries of the plurality of batteries to a displaced monitoring system.

5. The apparatus as in claim 2 wherein the at least one ambient condition sensor is selected from a class that includes at least a smoke sensor, a gas sensor, a fire sensor, a temperature sensor, a humidity sensor, a motion sensor, a radiant energy sensor, and a position sensor.

* * * * *